United States Patent [19]

Chen et al.

[11] Patent Number: 5,562,770
[45] Date of Patent: Oct. 8, 1996

[54] SEMICONDUCTOR MANUFACTURING PROCESS FOR LOW DISLOCATION DEFECTS

[75] Inventors: Bomy A. Chen, Hopewell Junction, N.Y.; Terence B. Hook, Jericho Center, Vt.; Subhash B. Kulkarni, Peekskill, N.Y.

[73] Assignee: International Business Machines Corporation, Armonk, N.Y.

[21] Appl. No.: 343,152

[22] Filed: Nov. 22, 1994

[51] Int. Cl.$^6$ ............................................. C30B 25/18
[52] U.S. Cl. ................... 117/90; 117/95; 117/96; 117/106; 437/95; 437/96
[58] Field of Search ..................... 117/90, 95, 96, 117/106; 437/95, 96

[56] References Cited

U.S. PATENT DOCUMENTS

| | | |
|---|---|---|
| 3,458,369 | 7/1969 | Marinace . |
| 3,808,674 | 5/1974 | Francombe et al. . |
| 3,821,033 | 6/1974 | Hu . |
| 3,997,368 | 12/1976 | Prtfoff et al. . |
| 4,079,506 | 3/1978 | Suzuki et al. . |
| 4,159,214 | 6/1979 | Mason . |
| 4,415,373 | 11/1983 | Pressley . |
| 4,631,804 | 12/1986 | Roy ......................... 29/576 W |
| 4,805,071 | 2/1989 | Hutter et al. ............... 361/313 |
| 4,830,984 | 5/1989 | Purdes ......................... 117/95 |
| 5,158,907 | 10/1992 | Fitzgerald, Jr. ............ 437/126 |
| 5,319,570 | 6/1994 | Davidson et al. ........... 364/488 |

FOREIGN PATENT DOCUMENTS

| | | | |
|---|---|---|---|
| 274618 | 11/1987 | Japan ....................... | 117/95 |
| 197128 | 8/1990 | Japan ....................... | 437/95 |
| 4-22167 | 1/1992 | Japan . | |

OTHER PUBLICATIONS

R. Beanland, et al., "Dislocations in Heteroepitaxial Films" Handbook on Semiconductors, vol. 3, Chapter 15, pp. 1174–1212, 1994.

W. R. Runyan, "The Status of Silicon Epitaxy" published in Semiconductor Silicon, ed. by R. R. Haberecht, Electrochemical Society, Inc., pp. 169–187, May 1969.

Y. Sugita, et al., "Misfit Dislocations in Bicrystal of Epitaxially Grown Silicon on Boron–Doped Silicon Substrates" Journal of Applied Physics, vol. 40, No. 8, pp. 3089–3094, Jul. 1969.

H. Kikuchi, et al., "New Gettering Using Misfit Dislocations in Homoepitaxial Wafers with Heavily Boron–Doped Silicon Substrates" Appl. Phys. Lett. 54 (5), pp. 463–465, 1989.

*Primary Examiner*—Robert Kunemund
*Attorney, Agent, or Firm*—Kris V. Srikrishnan

[57] ABSTRACT

The present invention provides a method of global stress modification which results in reducing number of dislocations in an epitaxially grown semiconducting device layer on a semiconductor substrate where the device layer and the substrate have a lattice mismatch. The invention teaches a method of imparting a convex curvature to the substrate by removing layer(s) of thin film from or adding layers of thin film to the back side of the substrate, so as to achieve a reduced dislocation density in the device layer.

16 Claims, 11 Drawing Sheets

SEMICONDUCTOR MANUFACTURING PROCESS FOR LOW DISLOCATION DEFECTS

FIELD OF INVENTION

The present invention is in the area of semiconductor manufacturing and is more specifically in the area of manufacturing silicon devices requiring thick epitaxial layers.

BACKGROUND OF THE INVENTION

Epitaxial layers of single crystalline silicon (Si) films grown over silicon substrate are widely used in semiconductor manufacturing. FIG. 1 shows a single crystal substrate 10, with a grown epitaxial layer 20 (epi layer) and an interfacial surface 30 (interface) such as discussed in this application. In some applications such as silicon on-insulator, substrate 10 need not be single crystalline. Layer 20 can in turn be comprised of a plurality of epitaxial layers and correspondingly a plurality of interfaces 30 can be present. Layer 20, as grown, is single crystalline and has the same crystal orientation as substrate 10. Therefore, layer 20 can be used to form various parts of a semiconductor device that requires the semiconducting single crystal behavior for device operation. Further, the ability to dope the epi layers with selected impurities at different concentrations during film growth simplifies device manufacturing processes and provides the ability to tailor the device structure. In addition, in the absence of epitaxy film layering capability, the choice of a substrate for a given device may be restricted. For example, a "latch-up" problem in high frequency circuits using Complementary Metal Oxide Semiconductor (CMOS) devices can be minimized or avoided by using a highly doped (or conductive) substrate. In the absence of this requirement, CMOS devices will be preferably built on a low doped, highly resistive substrates. Epitaxy layering in the manufacturing of CMOS devices is very valuable.

In silicon epitaxy, a thin single crystalline film (or layer) of Si is grown on a bulk single crystal Si substrate. In CMOS devices, usually a single layer of epitaxial film is used, in which the different parts of a Field Effect Transistor (FET) such as source, drain, channel are formed. In Bipolar devices, several epitaxial layers are typically formed, each one being used to form different parts of a bipolar transistor such as sub-collector, collector and base. In particular, the thickness of the sub-collector layer is kept large to minimize the resistivity of the sub-collector region. A second epi layer is deposited over a first epi layer and is used for defining the collector and base regions. Accordingly, the thickness of epitaxial films used in Bipolar devices is of the order of 6–10 microns, significantly higher than that required for CMOS devices.

The epitaxy process is usually carried out in a temperature range of 850° C. to 1200° C. and typical process conditions can be readily found in the literature (Runyan, in Silicon Devices, eds., Haberecht and Kern, 1969, The Electrochemical Society, pp. 169–187). The nucleation and growth of the epi layer 20, which has the same orientation as the Si substrate 10 on which it is grown, usually results in many associated point and line defects at the interface 30 as a result of the growth process. The generation of these defects is primarily to accommodate the lattice mismatch between the atomic ordering and spacing of the substrate underneath and the epi film growing on top of it. This mismatch among other things is strongly influenced by the difference in conductivity of the substrate and epitaxial layer. FIG. 2 shows a plot of lattice constant of a Si single crystal containing different dopant concentrations (Sugita and Tamura, Journal of Applied Physics, 40(8), 1969, pp. 389–394). The misfit grows progressively worse with increase in dopant concentration and difference in dopant concentration between substrate and the grown film. For example, when the substrate is heavily doped, an intrinsic or low doped layer will result in a larger misfit and larger mismatch strain than when the doping levels are similar. One type of common defect, called a misfit dislocation, is generated at the bulk Si—epi Si interface 30 of FIG. 1, as a way to accommodate and relieve this strain. Misfit dislocations are a source of dislocations in the epi films which can affect the device yield.

Another issue of importance in growing doped epitaxial film over doped substrates is the phenomenon of autodoping. Autodoping is the unwanted transfer of dopants present in the substrate into the grown epi layer, through the vapor phase, during the high temperature epitaxial growth process. Autodoping can occur between wafers and between regions of the wafer. For example, the backside of a highly doped substrate can contribute excess dopants to the epitaxy ambient that alters the concentration or kind of dopants that are being grown into the epi film. This autodoping is usually minimized or avoided by having a masking layer (such as silicon dioxide) to cover substrate surfaces, and further optimizing epitaxial process conditions such as deposition temperature and pressure. In most cases, where a blanket epi layer is desired on a highly conductive substrate, the backside of the wafer is selectively coated by using a low temperature process such as atmospheric chemical vapor deposition (APCVD), plasma enhanced chemical vapor deposition (PECVD) or low temperature oxide (LTO). These films usually have a compressive film stress similar to thermal oxide.

Defects such as dislocations are undesirable in single crystal Si substrates and epi Si layers, especially when they are present in regions where devices are to be formed. A dislocation or a cluster of dislocations attract metallic and ionic impurities and can provide an unwanted electrical conductive path between different regions of the semiconductor device. For example, a dislocation extending from a collector to an emitter region can cause leakage at low voltages in a Bipolar device. This is shown in FIG. 6, wherein a dislocation 290 extends across an emitter region 280 and a sub-collector region 220 thereby causing unacceptable emitter to collector current leakage. This type of leakage and associated yield losses will be referred to as pipe losses in this application. Pipe limited yield is an important measure in semiconductor manufacturing process and is used in the same connotation as pipe losses. Many precautions are taken in semiconductor manufacturing to reduce pipe losses.

The occurrence of misfit dislocations in epitaxy layer deposition has been widely studied. FIG. 3 (Kikuchi et al., Appl. Phys. Lett. 54(5), Jan. 1989, p. 464, FIG. 2) shows both theoretical calculation on when misfit dislocations can occur and also the observed occurrence of misfit dislocations for a 4 inch (100) oriented substrate. The experimental data is gathered using three different levels of boron (B) doped substrate and epi layers having a thickness in the range of 1–10 microns, and resistivities in the range of 0.7–1.3 ohm-cm. Both the experimental and theoretical curves show the trend that when the substrate conductivity is increased, the critical thickness of an epitaxy layer to avoid misfit dislocation generation decreases sharply. Heretofore, an application desiring a high conductivity substrate would be limited to a thinner epitaxial layer in order to avoid misfit dislocation generation. The difference between calculated and observed curves suggest that the theory probably predicts sufficient conditions for misfit dislocation occurrence and the experimentally observed data suggest that other factors play a role to mitigate the mismatch effect. However, the experimental curve and the theoretical curve clearly follows the same trend that when there is a large mismatch in conductivity between the substrate and the epi layer, the epi layer thickness need to be kept small to avoid generation of misfit dislocations.

CMOS devices usually can be designed with an epi layer of the order of less than 5 microns, as the FET is a surface device and the source, channel and drain regions are shallow with respect to the surface of the epi layer. However Bipolar devices require thicker epi layers. In devices such as BiCMOS, the combined requirements of a thicker epi film for Bipolar devices and a high conductive substrate for CMOS devices, lead to unacceptable pipe losses. Accordingly, there is a clear need for methods and processes that allow decoupling of substrate conductivity and the thickness of epitaxial layers without the concern of pipe losses.

It is therefore a feature of the present invention to provide a method to provide epitaxially grown semiconductor layers usable thickness with low resistive substrates with minimal dislocations.

It is a feature of the present invention to provide a process that improves pipe limited yield in processes requiring a thick epitaxy layer such as the formation of BiCMOS devices.

It is a further feature of the present invention that such a process be compatible with conventional semiconductor manufacturing processes.

It is yet another feature of the present invention that such a process be relatively simple and inexpensive.

SUMMARY OF THE INVENTION

The present invention provides a method of global stress modification which will result in reducing number of dislocations in an epitaxially grown semiconducting device layer on a semiconductor substrate where the device layer and the substrate have a lattice mismatch. The invention teaches a method of imparting a convex curvature to the substrate by removing layer(s) of thin film from or adding layers of thin film to the back side of the substrate, so as to achieve a reduced dislocation density in the device layer.

BRIEF DESCRIPTION OF THE DRAWINGS

The objects, features and advantages of the invention will be apparent from the following more particular description of the invention illustrated in the accompanying drawings, in which.

DETAILED DESCRIPTION OF THE INVENTION

Figure 6:
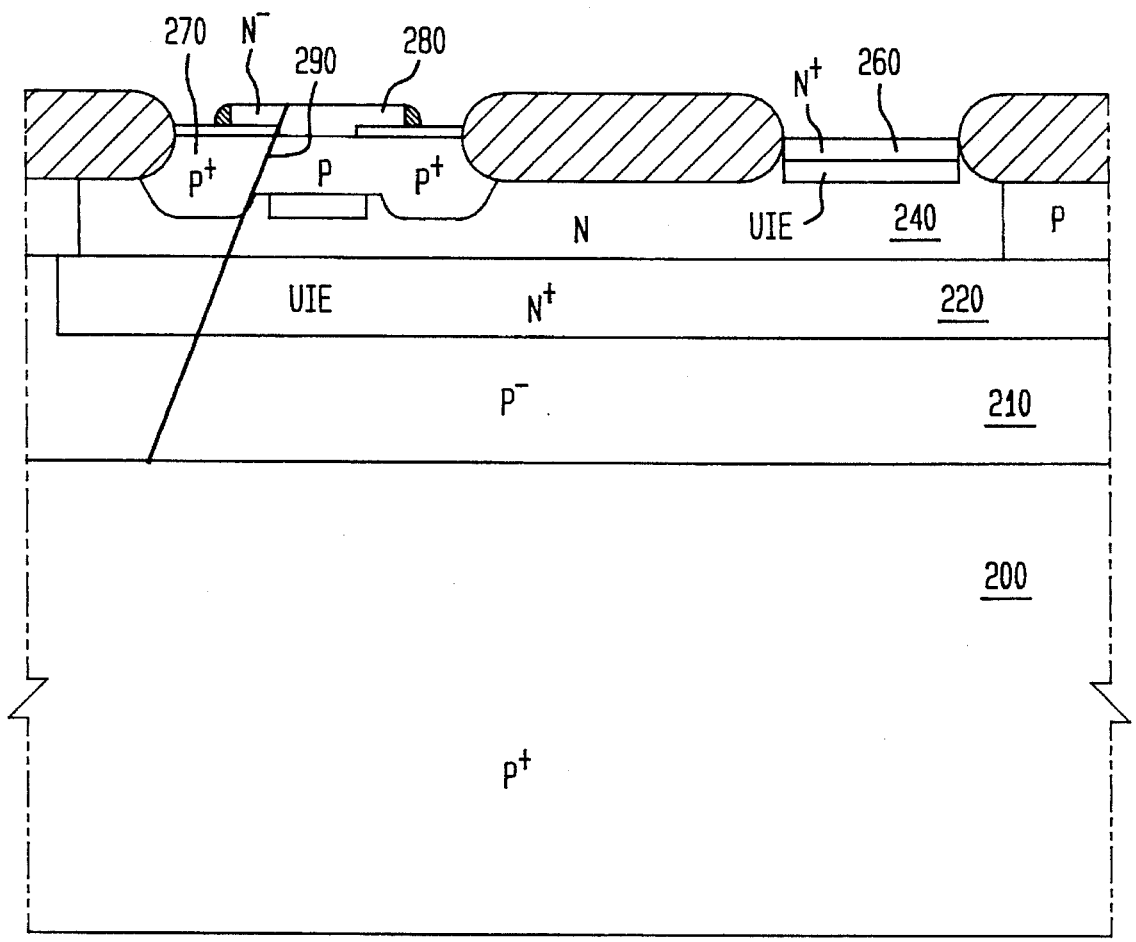
FIG. 6 is a cross-sectional view of a vertical Bipolar device illustrating a dislocation across an emitter base-collector junction, which is called a pipe.
Figure 11:
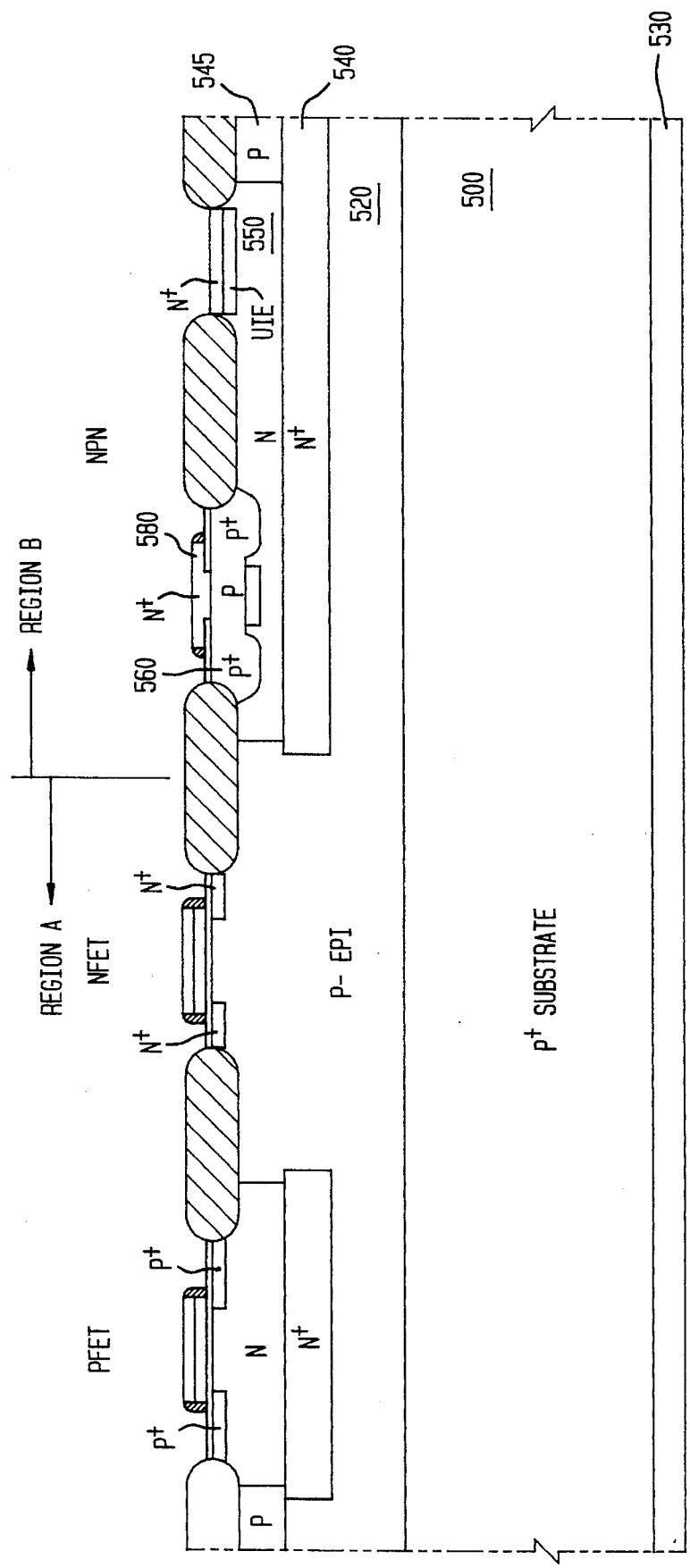
FIG. 11 is a cross sectional view of a typical BiCMOS device.

The present inventors have discovered that in the fabrication of BiCMOS devices, pipe losses seem to increase appreciably with an increase in wafer size, with parameters such as composition of the epi layers, conductivity of the substrate and other nominal process conditions remaining the same. A typical cross sectional view of a BiCMOS device is shown in FIG. 11, wherein region B contains a vertical Bipolar device and region A contains a FET device. FIG. 6 shows a vertical Bipolar device, which is similar to that shown in region B in FIG. 11. The chip is considered defective unless both devices meet their design specification. This BiCMOS device for example, would require the use of a thicker epi layer in conjunction with a highly conductive substrate than a CMOS device, conditions that lead to large pipe losses based on earlier discussions.

Figure 1:
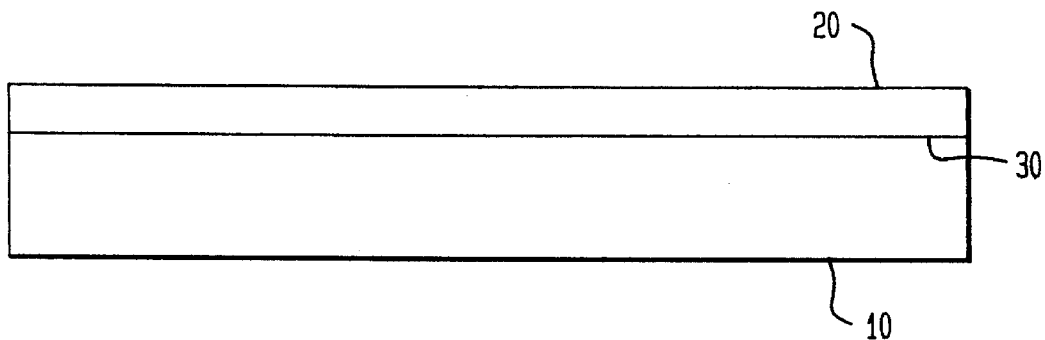
FIG. 1 is a cross sectional view of a Si substrate with an epi layer used in the manufacture of a semiconductor.
Figure 2:
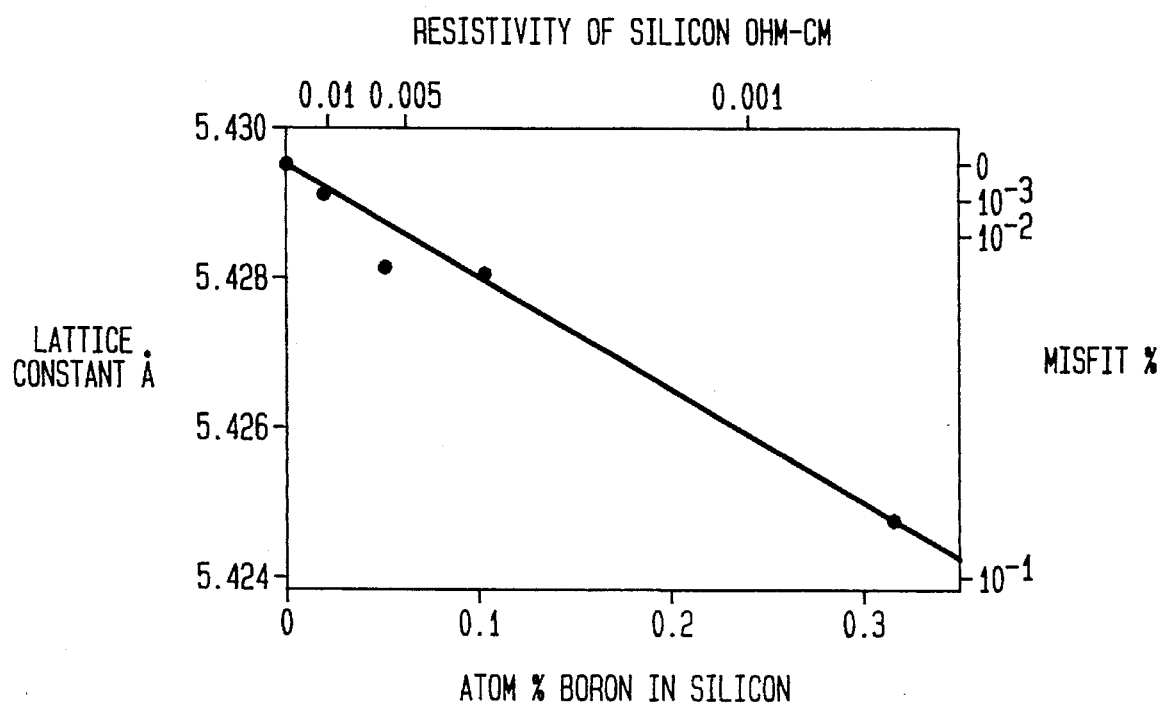
FIG. 2 is a plot of boron in solution versus lattice parameter of single crystal silicon.
Figure 3:
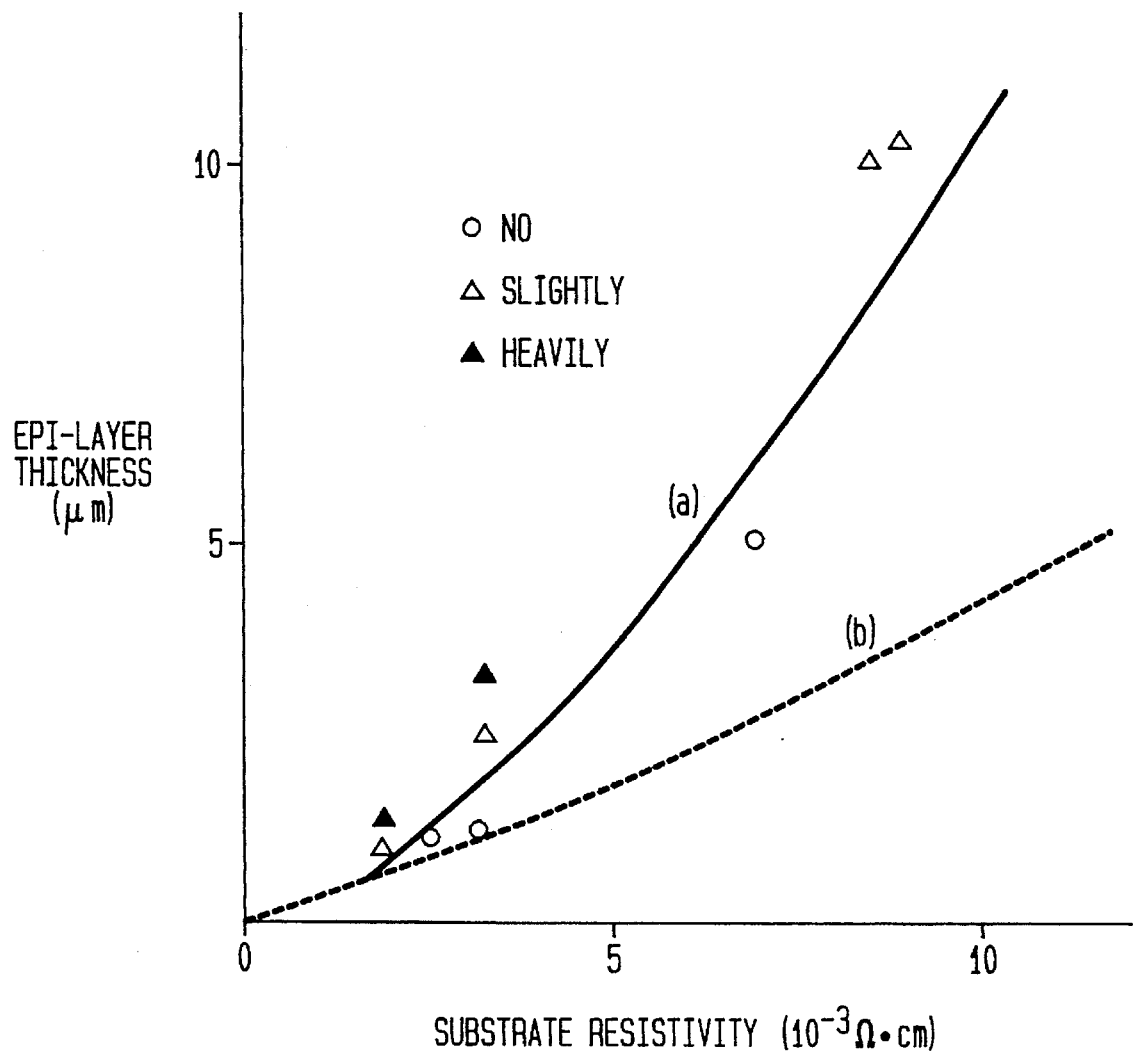
FIG. 3 is a plot of experimental and theoretical study of misfit dislocation generation as a function of epi layer thickness and substrate resistivity.
Figure 4:
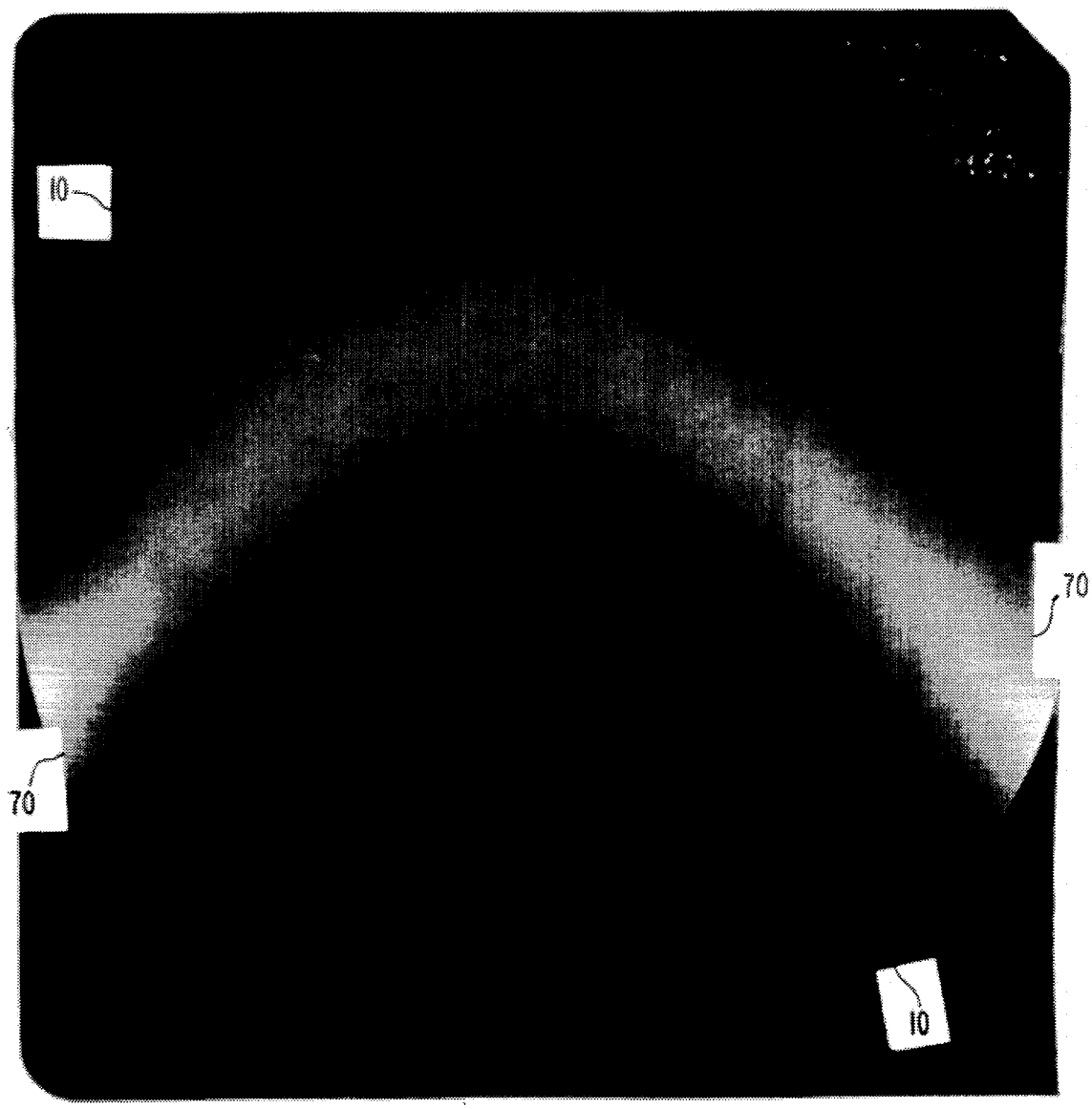
FIG. 4 is an X-ray topography of a Si substrate surface showing dislocations intersecting top surface.
Figure 5A:
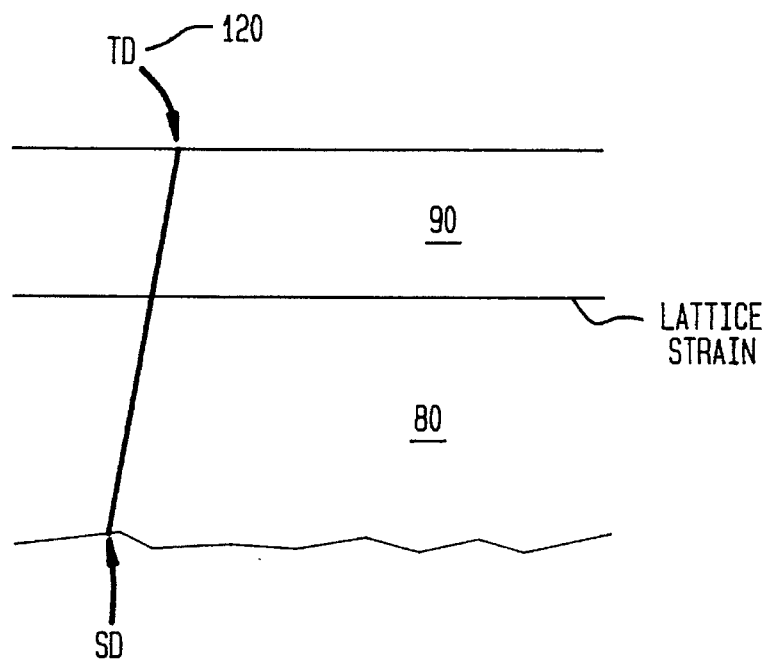
FIGS. 5A and 5B show a magnified view of the accommodation of lattice strain at the interface by generation of misfit dislocation and the motion of threading dislocation into the epi layer during subsequent hot processing.
Figure 5B:
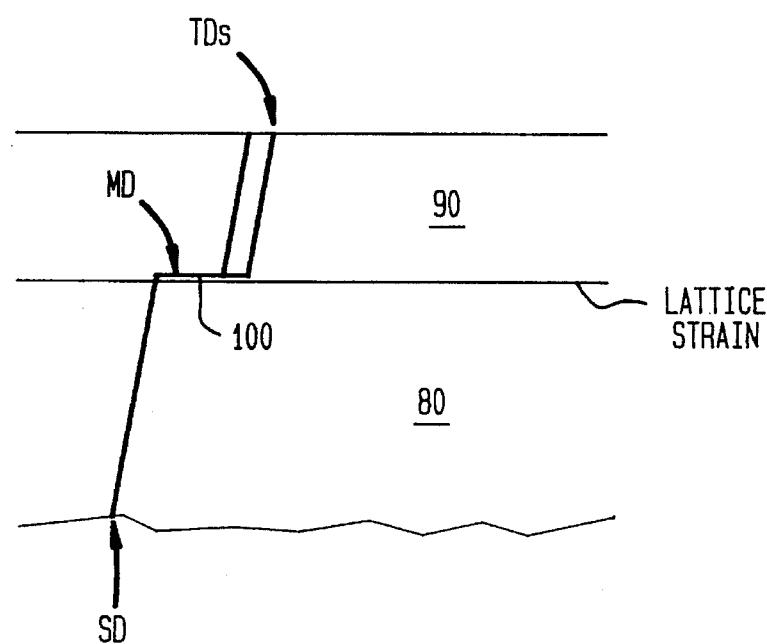

FIG. 4 is an X-ray topography of a silicon substrate 10, with the surface showing the dislocation intersection 70 at the surface. The substrate 10 in FIG. 4 is 200 mm in diameter and the X-ray topography shows large number of intersections 70 (implying a large dislocation density) near the perimeter of the wafer. FIG. 5A is an illustration of a threading dislocation(TD) 120 in the epi layer and a corresponding substrate dislocation (SD) in a p- epi layer 90 over a p+ substrate 80. FIG. 5B shows the motion of threading dislocations in the epitaxial layer 90 under hot processing and associated stresses along with misfit dislocations 100 at the mismatched interface, generating more dislocations in the epi layer 90. The dislocations as formed after the epi layer growth are usually stable across the interface. However when sufficient stress or thermal energy is applied, the threading dislocations can move and create several threading dislocations (TDs), which in turn can move within the epi layer and generate newer dislocations. The lower oxygen concentration of typical epi films make it easy for the TD's to move. Also the ease of creation of the MD component makes it possible for the TD to move without the motion of SD. Similarly, the movement of a TD in an epi layer over a like substrate (p- epi over p- substrate), will be more difficult since it will have to create MDs at a more perfect interface (no mismatch). Thus, the motion of TDs assisted by the misfit of the interface can increase the dislocation density in the epi layer. Hot processes, when applied to substrates, causes the movement of dislocations and the creation of threading dislocations in two ways. First, the high temperature of the process provides thermal activation to increase the motion of dislocations which are otherwise stable. Second, the non-uniformity associated with the hot processes create thermal stresses which cause the dislocations to move and generate additional dislocations by other mechanisms such as anchoring or immovable locations. An exhaustive review on this complex subject is given by Beanland et al., "Dislocations in heteroepitaxial films", in Handbook of Semiconductors, Vol. 3a, Editor Mahajan, North Holland, 1994, pp. 1149–1230. The chapter in specific reviews the case of low misfit semiconductor to semiconductor interfaces that the present invention is concerned with (pp. 1174–1207). The review further discusses extensively homogeneous and heterogenous nucleation of dislocations and their multiplication, but provides no direction for minimizing the dislocation density. U.S. Pat. No. 5,158,907 overcomes this problem, by geometrically defining the lateral dimensions of device regions to be comparable to thickness of the device regions in Ga-As devices. This geometrical design assures that the threaded dislocations exit laterally the regions of interest for device formation, where it is harmless. The present inventors have recognized based on experimental studies that the global stress levels experienced by the device layer has a significant role in dislocation generation and pipe losses in the device layer. Further, the present inventors have shown that the global stress experienced by the device layer can be modified to achieve lower dislocation density and lower pipe losses. This demonstration and observation, even though discussed with specific reference to Si, can be applied to other devices and materials, where substrates and grown device layers have appreciable misfit strains. The present inventors have hypothesized that the generation of the harmful dislocations is driven by the magnitude and sign of thermal stresses experienced by the epi layer (device layer). In actual experience, the thermal stresses add to residual stresses in the wafer from other processes such as grinding (Blech and Dang, Solid State Technology, August 1994, pp. 74–76) and the net stress only is of interest.

Figure 7A:
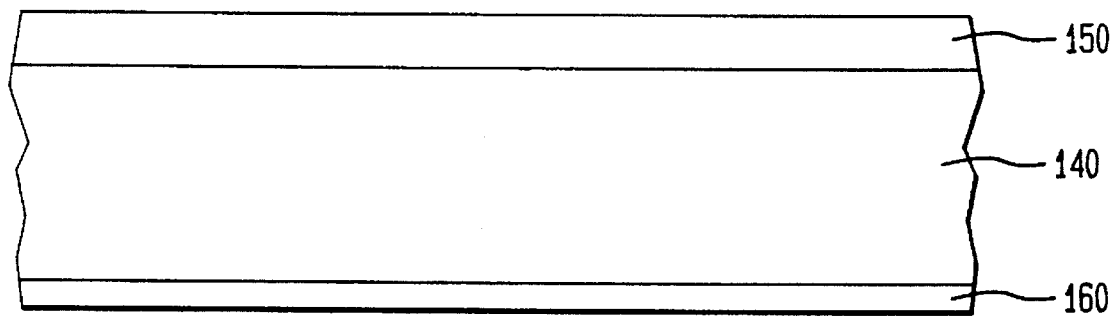
FIGS. 7A–7C are illustrations of wafer warpages associated with film stresses.
Figure 7B:
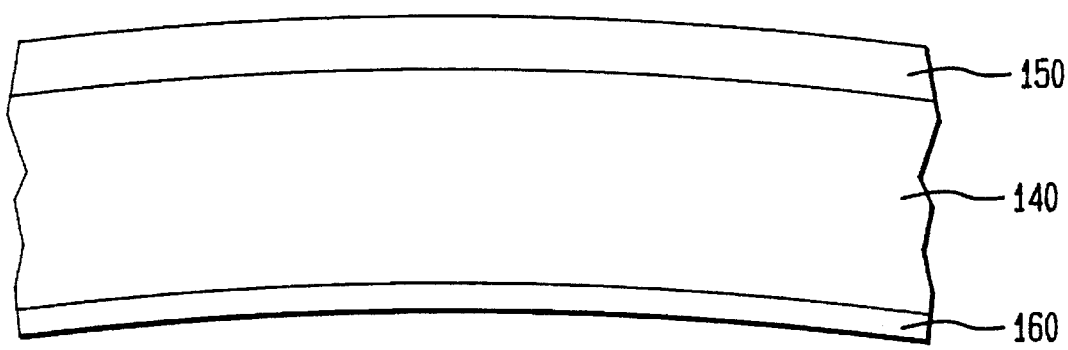
Figure 7C:
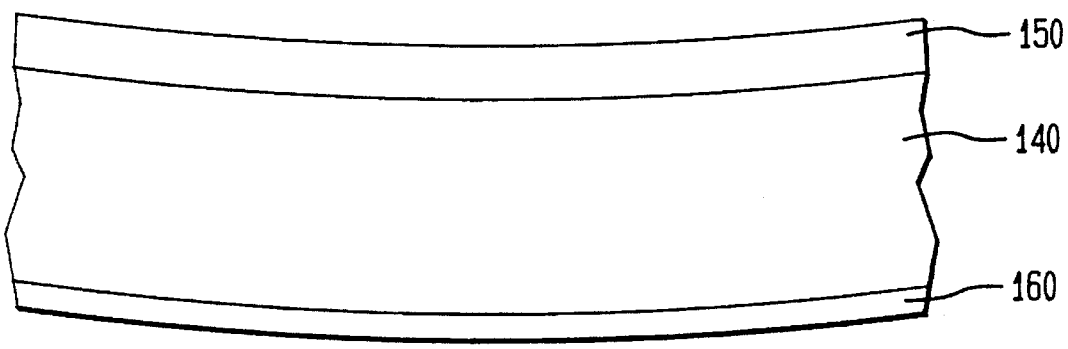

FIGS. 7A, 7B and 7C show a substrate 140 having a device layer 150 at the top and another layer of film 160 at the bottom of a substrate 140. When films are grown on a substrate, the nucleation and growth process results in imparting a stress to the film which is called intrinsic stress. This is to be distinguished from thermal stress, which comes from differential thermal expansion of two films in contact during heating or cooling and resulting from the differences in the thermal coefficient of expansion. The origin of film stress can be understood as follows: the compressive nature of the film comes from the fact that the film would like to expand but is restricted by the substrate from expansion, and tensile nature of the film results from the fact that the film would like to contract and being kept stretched by the substrate. For the follow on discussions, we will assume that device layer 150 has no intrinsic stress and that substrate 140 also has no stresses from prior processes. Layer 160 has some intrinsic stress, which determines the curvature of the wafer substrate 140 and device layer 150. In FIG. 7A, the substrate is flat and is essentially strain and stress-free, corresponding to the case when layer 160 also has negligible intrinsic stress. In FIG. 7B, stress in layer 160 is tensile and tends to warp the substrate in a convex manner viewing the curvature from the top side of the substrate. FIG. 7C shows the substrate in a concave shape, when stress in bottom layer 160 is dominating and compressive.

Figure 12A:
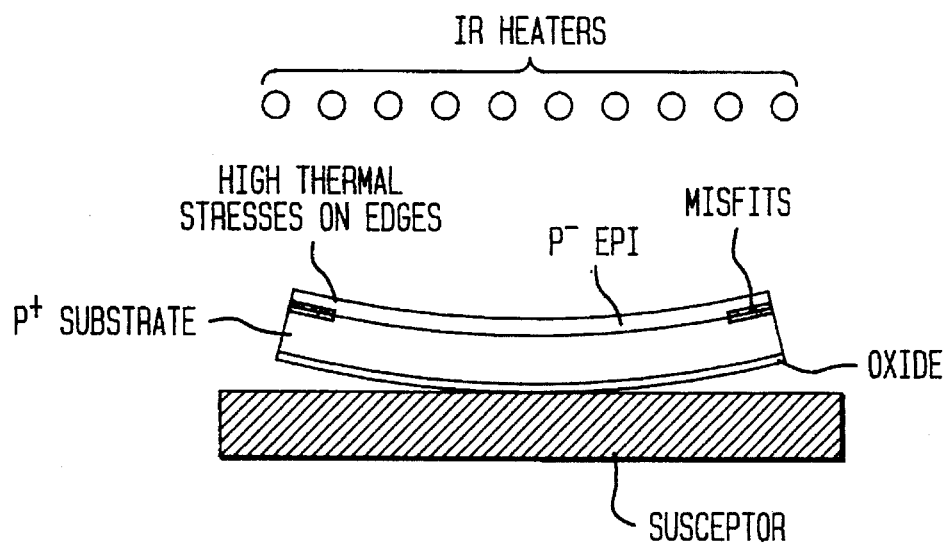
FIGS. 12A and 12B are illustrations of a concave and a convex shaped wafers being heated in an epi reactor.
Figure 12B:
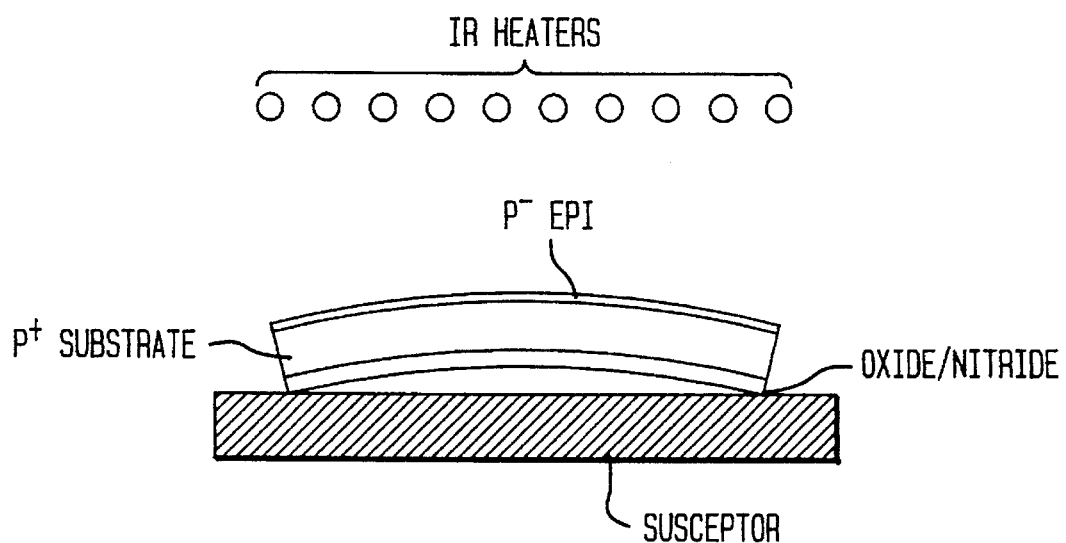

In most practical applications such as addressed by the present invention, the thin film on the back surface and prior substrate processing operations such as grinding determines the magnitude and direction of the net stress and determines if the substrate is convex or concave. Our earlier assumption regarding device layer 150 having low stress and therefore not a significant factor in determining the wafer curvature is quite reasonable. However, the intrinsic substrate stresses from processing can be significant, resulting in some wafer curvature as received. Further, the backside masking layers usually have stresses that are also significant. The backside layers are typically thermally grown silicon oxide, CVD silicon nitride or low temperature oxide, for the examples discussed in here. In particular, the layers used for preventing autodoping are deposited by a low temperature silicon dioxide process such as APCVD or PECVD as discussed earlier. These films are usually compressive as deposited. The backside oxide film being compressive, the substrate tends to have a concave curvature as in FIG. 7C. The effect of concave curvature is that the top part of the substrate including the epi film experiences equivalent of an external compressive stress and by the observation of the inventors lead to large dislocations and device losses. The present inventors hypothesize that a concave curvature lead to device layer degradation. When the wafers are heated in a single wafer susceptor as used with larger substrates, the thermal activation contributes to the motion of threading dislocations as discussed earlier. More dislocations tend to be generated near the edge of the wafer and the problem becomes worse for larger wafers. The present inventors have made another observation, that when heating of the wafers is done by radiant heating from the top with the wafer sitting on a susceptor as shown in FIG. 12A, the temperature near the middle of the wafer is cold and the edges of the wafer are hot for a concave substrate. This is probably due to the better thermal contact of the substrate to the susceptor at the center than at the edges. As a result of the higher temperatures, the wafer edges are subjected to higher thermal stresses, the magnitude of which are given by the equation, $$\sigma = \alpha E \Delta T$$

Where $\alpha$ is the thermal coefficient of expansion, E the elastic modulas and $\Delta T$ is the temperature difference between the edge and the middle parts of the wafer. This high thermal stress in conjunction with higher temperature of the edge regions of the wafer results in large number of dislocations near the perimeter of the wafer. The situation is opposite when the shape of the substrate is convex as in FIG. 12B. On heating, the center of the wafer is hotter and the edges are cooler and defect generation if any is confined to the center of the wafer. There are likely other reasons not enumerated here that may be at work in additional to stress considerations.

Irrespective of the accuracy of the hypothesis proposed by the present inventors, the inventors have experimentally observed and shown that when the Si substrates have a concave shape, the pipe losses are significantly higher than when the substrates start out with a convex curvature.

The present inventors have recognized that this problem can be overcome by deliberately changing the nature and magnitude of the stress experienced by the epi layer, so that even with thermal activation from hot processing, the dislocation motion and generation can be reduced or prevented. Accordingly, the present inventors have proposed process changes that minimizes the concavity of the substrates and preferably makes the substrate slightly convex as in FIG. 7B. Japanese patent application No. JP4022167 recognizes that compressive stress exerted on an epi layer by a buried oxide material in an isolation region is detrimental to device yield. JP4022167 invention is concerned with localized stress and the generation of local defects associated with the local stress. JP4022167 proposes locating the oxide regions at least 0.9 micron below the device region. In contrast, the present invention is concerned with the deleterious effect of global stresses in the epi layer and a global curvature of the substrate. The present invention proposes a solution to impart a desirable curvature on the substrate so as to minimize dislocation motion and multiplication in the device layer. The essence of the present invention is a modified process sequence that can be used in semiconductor manufacturing especially those that employ epi layer deposition and in particular processes that are used in manufacturing of BiCMOS devices. There are other applications in semiconductor manufacturing that have similar misfit problems such as silicon on insulator devices, (device layer over insulating substrates) and III–V compound devices (by epitaxially growing single crystal device films on different substrate) by Metallo-organic chemical vapor deposition (MOCVD), Molecular beam deposition etc. In all these cases, the problem of dislocation generation from the mismatched device layer and substrate can be minimized by the use of the present invention. The invention will be illustrated by the following examples.

Figure 8:
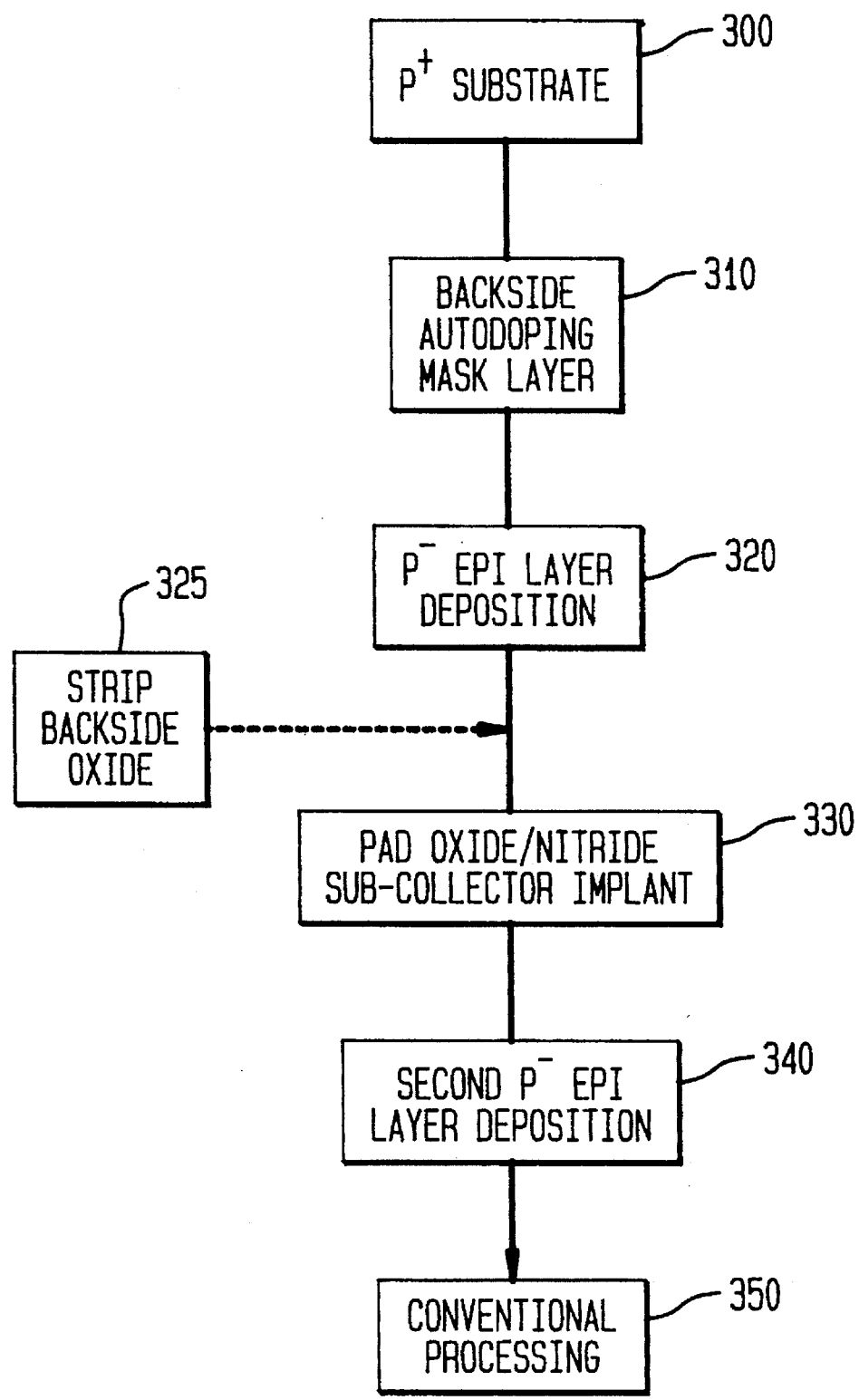
FIG. 8 is an embodiment of the present invention used to build a BiCMOS device.
Figure 10A:
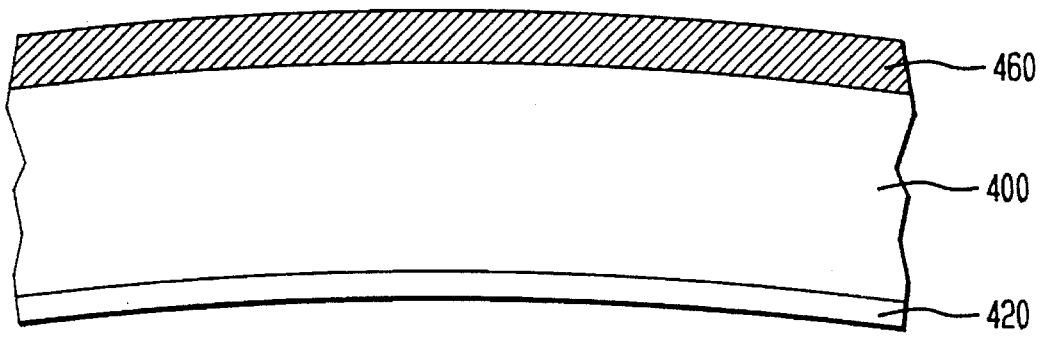
FIGS. 10A–10C are cross sectional views of a silicon wafer illustrating two embodiments of the present invention.
Figure 10B:
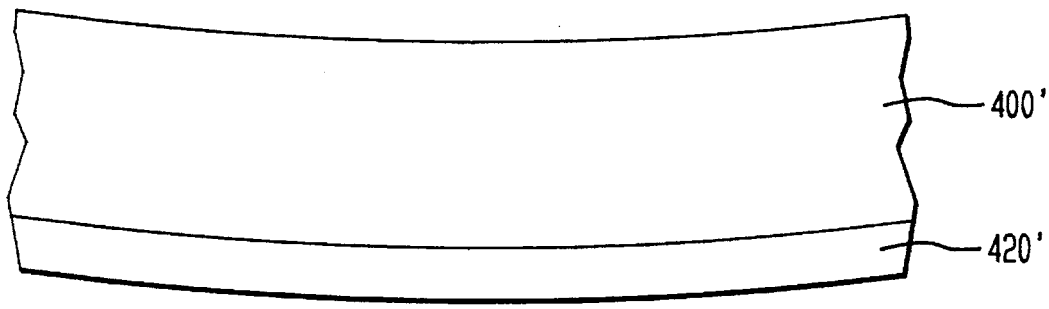

FIG. 8 shows some of the process steps used for manufacturing a typical BiCMOS device such as shown in FIG. 11. Both figures will be uses to describe an example process contained in FIG. 8. A highly doped substrate 500 of boron p+ is obtained by means of conventional crystal growing, dicing and polishing techniques as in step 300. In step 310, an autodope masking layer 530 is deposited on the back side of the substrate. In step 320, the wafer is placed in an epi reactor and a thick layer of p– epi film 520 is grown on the front side of the substrate. The notation of dopants or impurities by p+, p–, n+, n– used in this discussion refers to type and quantity of dopants following usual notations practiced in the semiconductor industry. For example, p– or n– can denote impurity concentration ranging from $10^{15}$ to $10^{19}$ atoms/cc and p+ or n+ can denote impurity concentration ranging from $10^{19}$ to $10^{21}$ atoms/cc. In step 325, the compressive layers on the backside are removed so as to impart a convex curvature to the device layer. This concept is illustrated in FIG. 10A and FIG. 10B. In step 330, pad oxide/nitride layers are grown and patterned to facilitate antimony (or arsenic) implant sub-collector region 540 (n+). In step 340, the sub-collector mask is removed and a second epi layer 545 p-is grown. Several known process steps are used to form other device regions such as isolation, n or p well, channel, base and emitter etc. to build the respective FET and Bipolar devices. These steps are not specifically discussed herein, since they are known in the art and the present invention is achieved in the steps 300–340 discussed above. For example, a batch of 20, 200 mm diameter wafers were split into two equal groups, one using the processes described without the use of step 325 above and the second group using process steps including step 325 as shown. As discussed earlier, process step 325 resulted in changing the wafer curvature from concave to convex. The bow of the wafers measured on wafers from both groups prior to step 330. Group 1 showed a bow (maximum deflection of the wafer center) of –20 to 0 microns and the experimental group 2 showed a bow of +10 to +20 microns, showing that the object of converting the substrate from concave to convex has been achieved in group 2. FIG. 10A illustrate a wafer with a concave curvature and a negative bow similar to the wafers in group 1. The autodoping masking layer 460 is compressive. FIG. 10B shows that the compressive layer 460 has been removed resulting in convex shaped substrates with a positive bow. The calculation of any one of film thickness, film stress, wafer thickness and wafer bow given the values of the other is well known (Blech and Robles, Solid State Technology, September, 1994, pp. 75–76). Therefore, the change in bow as a result of removal or addition of a stressed film, can be calculated and verified. This methodology is not reviewed here as it can be readily found in prior art. The wafers were processed to completion and the average pipe yield of group 1 wafers was 61.7% (corresponding to FIG. 10A) and the average pipe yield of the wafers from second group was 84.9% (corresponding to FIG. 10B), clearly validating the inventors' hypothesis of the pipe loss problem and their solution. The present inventors recognize that other considerations such as lithography clearly limit the maximum curvature acceptable for a substrate.

Figure 9:
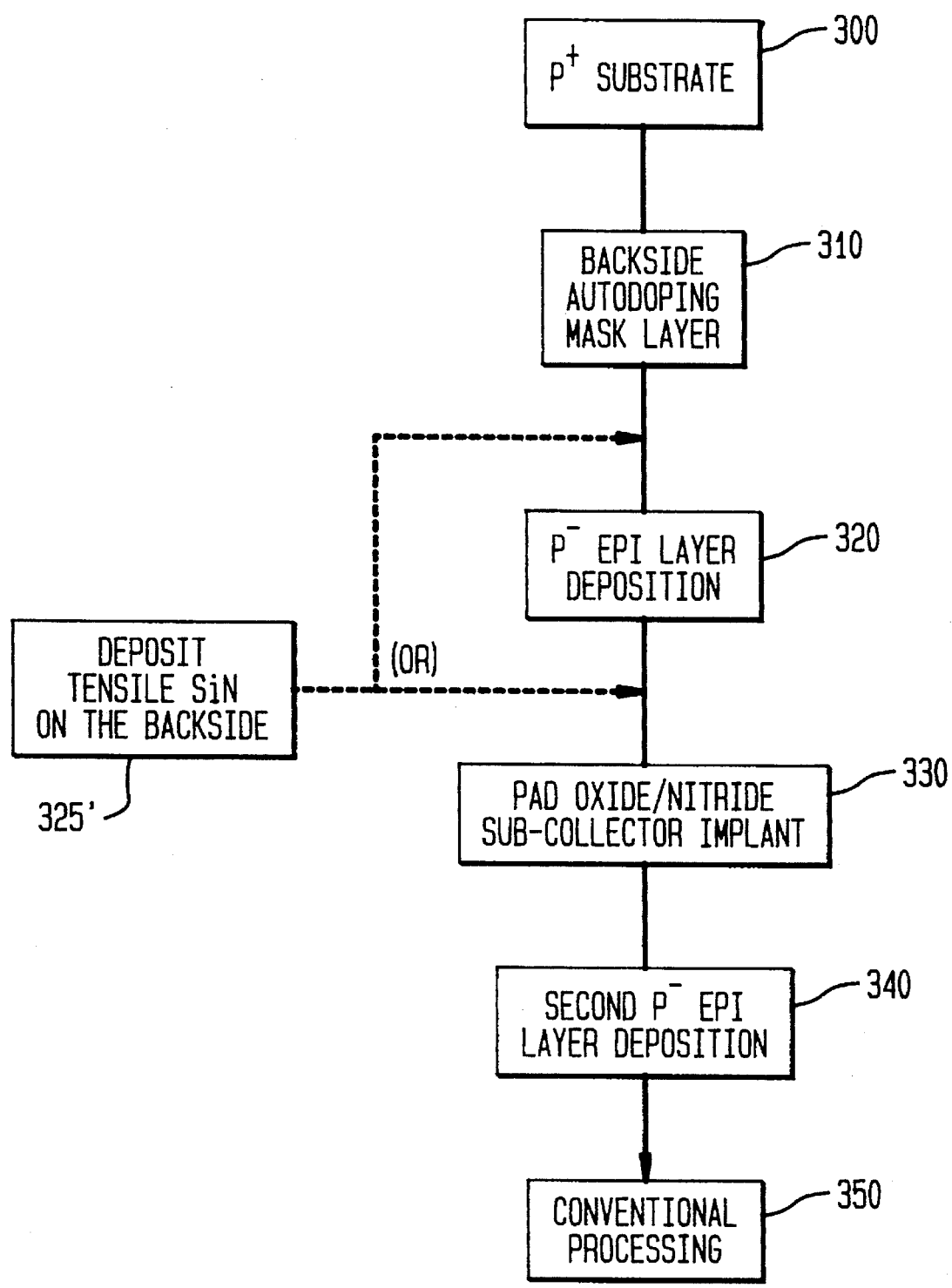
FIG. 9 is an alternative embodiment of the present invention to build a BiCMOS device.
Figure 10C:
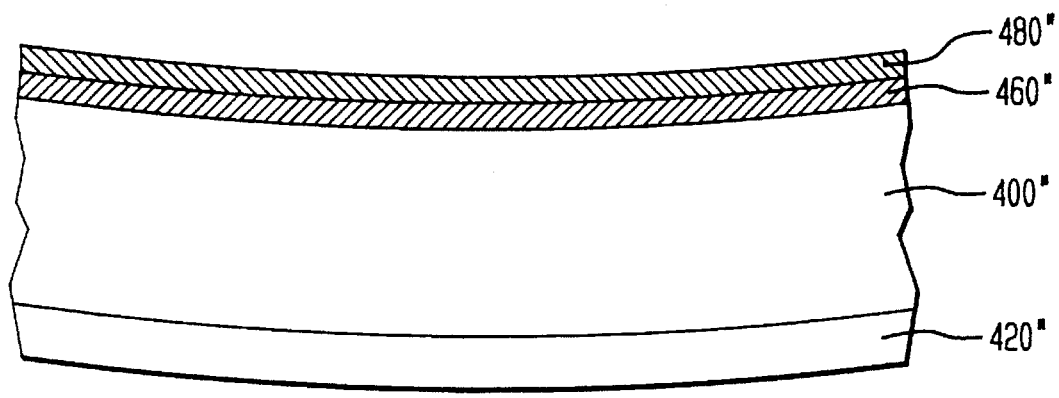

An alternate method is shown in FIG. 9 to achieve a change in wafer bow. Referring to FIG. 9, an alternate method can be used at step 325' (instead of removing the backside autodoping mask layer at step 325). In this case, a film of tensile stress SiN was deposited in sufficient thickness, so that the stress-thickness product of this layer is larger quantitatively than the stress-product of the autodoping compressive mask layer. This additional step can be performed either before the epi layer deposition or after the epi layer deposition as shown by the dotted lines. This implementation is also easily accomplished in manufacturing and has similar final benefit as taught by this invention. The result of the alternate process is shown in FIG. 10C, where an additional layer 480" has been added to the back side of the substrate 400" imparting a convex curvature. The wafer is then processed as in the previous example. The nominal thickness of the autodoping mask layer 460" is usually 5KA of low temperature oxide with a compressive stress in the range of $1-2 \times 10^9$ dynes. To overcome this, a silicon nitride film is chosen for additional layer 480". For SiN films with an intrinsic stress in the range of $1-10 \times 10^9$ dynes tensile, a thickness of 5KA to 10KA is chosen. The above range is only an example and the actual thickness will be determined by a more exact calculation as described in Blech and Robles reference.

Both these embodiments and earlier description show that wafer curvature manipulation is easy to implement in a manufacturing process, involves minimal additional processing and results in appreciable improvement in pipe yield. The present invention has great utility in semiconductor manufacturing involving mismatched single crystal films and substrates. The present invention is more specifically beneficial to the manufacture of high performance BiCMOS devices and likely to benefit other applications such as SOI and Ga-As devices.

While the invention has been described in terms of a single preferred embodiment, various alternatives and modifications can be devised by those skilled in the art without departing from the invention. Accordingly, the present invention is intended to embrace all such alternatives which fall within the scope of the appended claims.

What is claimed is:

1. A method of reducing number of dislocations in an epitaxially grown device layer on one side of a semiconductor substrate, said device layer and substrate being characterized by lattice misfit, comprising the steps of:
   a) providing a substrate having front and back sides;
   b) epitaxially growing the device layer on front side of said substrate; and,
   c) processing said back side of said semiconductor substrate, whereby at the end of the steps a), b) and c), a convex curvature is imparted to the front side of said substrate.

2. The method of claim 1, wherein said processing of said back side consists of etching to remove layers on said back side of said substrate, so as to impart a convex curvature to the front side of said substrate.

3. The method of claim 1, wherein said processing of said back side consists of depositing at least one insulating layer with a net tensile stress, on said back side of said substrate, so as to impart a convex curvature to the front side of said substrate.

4. The method of claim 3, wherein the insulating layer is selected from the group consisting of silicon dioxide, silicon nitride, silicon oxynitride and aluminum oxide.

5. The method of claim 1, wherein said substrate has a concave surface as provided, prior to process steps 1(b) and (c).

6. The method of claim 1, wherein said device layer has a resistivity in the range of 0.5 to 50 ohm-cm and a thickness in the range of 0.5 to 10 microns.

7. The method of claim 6, wherein the device layer is doped with impurities selected from the group consisting of boron, phosphorus, arsenic and antimony.

8. The method of claim 1, wherein the substrate has a resistivity of 0.1 to 0.001 ohm-cm.

9. The method of claim 8, wherein the substrate is doped with impurities selected from the group consisting of boron, phosphorus, arsenic and antimony.

10. The method of claim 1 wherein the device layer is a compound semiconductor layer containing the elements selected from the group consisting of Ga, As, In, Sb and Al.

11. The method of claim 1 wherein said substrate has an insulating surface.

12. A method of building a BiCMOS device with reduced pipe losses comprising the steps of:
   a) providing a substrate of a first conductivity with a front and a backside having a high concentration of impurity;
   b) processing the backside of said substrate so as to impart a convex curvature to the frontside of said substrate;
   c) growing a first epitaxy layer of same conductivity as the substrate having a lower concentration of impurity than said substrate, on the front side of said substrate;
   d) forming doped regions of second conductivity to form at least one sub-collector region;
   e) growing a second epitaxy layer of similar conductivity and concentration as the first epitaxy layer; and
   f) forming other device regions using known processes to complete said BiCMOS device,
      whereby, at the end of steps b)–e), a convex curvature is imparted on the front side of said substrate.

13. The method of claim 1, wherein said convex curvature is characterized by a bow of at least +10 microns.

14. The method of claim 1, wherein said substrate and device layer are silicon of same crystallographic orientation differing only in dopant concentration.

15. The method of claim 12, wherein said processing of backside consists of depositing insulating films with a net tensile stress.

16. The method of claim 15, wherein the insulating films are selected from a group consisting of silicon dioxide, silicon nitride, silicon oxynitride and aluminum oxide.

* * * * *